US011730024B2

(12) United States Patent
Oh et al.

(10) Patent No.: US 11,730,024 B2
(45) Date of Patent: Aug. 15, 2023

(54) DISPLAY DEVICE WITH FIRST, SECOND, AND THIRD LINES ON DIFFERENT LAYERS CONNECTED TO FORM WIRING

(71) Applicant: Samsung Display Co., LTD., Yongin-si (KR)

(72) Inventors: Sang Hoon Oh, Seoul (KR); Seung Gyu Tae, Osan-si (KR); Hyun Woo Kang, Yeosu-si (KR); Dong Hyeok Lee, Yongin-si (KR); Chang Ho Yi, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 394 days.

(21) Appl. No.: 17/031,018

(22) Filed: Sep. 24, 2020

(65) Prior Publication Data

US 2021/0265445 A1    Aug. 26, 2021

(30) Foreign Application Priority Data

Feb. 21, 2020    (KR) .......................... 10-2020-0021539

(51) Int. Cl.
*H10K 59/131*    (2023.01)
*H10K 59/35*    (2023.01)

(52) U.S. Cl.
CPC .......... *H10K 59/131* (2023.02); *H10K 59/35* (2023.02)

(58) Field of Classification Search
CPC ............ H01L 27/3276; H01L 27/3211; H10K 59/131; H10K 59/35
See application file for complete search history.

(56) References Cited

U.S. PATENT DOCUMENTS

| | | | |
|---|---|---|---|
| 6,996,832 B2 | 2/2006 | Gunduc et al. | |
| 2008/0006858 A1* | 1/2008 | Liu | G02F 1/1345 257/294 |
| 2010/0253610 A1* | 10/2010 | Lee | G09G 3/3611 438/23 |
| 2016/0321996 A1* | 11/2016 | Lee | G09G 3/3291 |
| 2017/0069666 A1* | 3/2017 | Koide | H01L 27/3279 |
| 2017/0077143 A1* | 3/2017 | Lee | G02F 1/1345 |
| 2018/0374445 A1* | 12/2018 | Her | G02F 1/1345 |
| 2019/0036065 A1 | 1/2019 | Lee et al. | |
| 2019/0319046 A1* | 10/2019 | Tominaga | H01L 27/0296 |
| 2020/0341573 A1* | 10/2020 | Yang | G02F 1/13338 |

FOREIGN PATENT DOCUMENTS

| | | |
|---|---|---|
| KR | 10-2012-0136743 | 12/2012 |
| KR | 10-2018-0021341 | 3/2018 |

* cited by examiner

*Primary Examiner* — Lex H Malsawma
(74) *Attorney, Agent, or Firm* — Kile Park Reed & Houtteman PLLC

(57) ABSTRACT

A display device may include a first pixel column disposed on a substrate, a second pixel column adjacent to the first pixel column, a third pixel column adjacent to the second pixel column, and a first wiring, a second wiring, and a third wiring respectively and electrically connected to the first pixel column, the second pixel column, and the third pixel column. Each of the first wiring, the second wiring, and the third wiring may include a first line, a second line electrically connected to the first line, the first line and the second line being disposed on different layers, and a third line electrically connected to the second line, the first line, the second line, and the third line being disposed on different layers.

20 Claims, 8 Drawing Sheets

DISPLAY DEVICE WITH FIRST, SECOND, AND THIRD LINES ON DIFFERENT LAYERS CONNECTED TO FORM WIRING

CROSS-REFERENCE TO RELATED APPLICATION(S)

This application claims priority to Korean Patent Application No. 10-2020-0021539 under 35 U.S.C. § 119, filed in the Korean Intellectual Property Office (KIPO) on Feb. 21, 2020, the entire disclosure of which is incorporated herein by reference.

BACKGROUND

1. Technical Field

The present disclosure generally relates to a display device, and more specifically, to a display device with a difference in luminance between pixel columns reduced.

2. Description of the Related Art

In general, display devices refer to devices that display an image for providing visual information to a user. Recently, of display devices, an organic light emitting display device has attracted attention. The organic light emitting display device has a self-luminous characteristic and, unlike a liquid crystal display device, does not require a separate light source, thereby reducing the thickness and weight of the display device. In addition, the organic light emitting display device exhibits high quality characteristics such as low power consumption, high luminance, and high response speed.

A display device may include pixel columns including pixels. The pixel columns may be respectively and electrically connected to wirings, and may receive signals such as a data signal or the like and voltages from the wirings. In case that a difference in resistance between the wirings is relatively significant, a difference in voltage drop between the data signals transmitted through the wirings may be significant. Therefore, a difference in luminance between the pixel columns may be significant.

SUMMARY

Some embodiments of the invention provide a display device with a difference in luminance between pixel columns reduced.

A display device according to an embodiment may include a first pixel column disposed on a substrate, a second pixel column adjacent to the first pixel column, a third pixel column adjacent to the second pixel column, and a first wiring, a second wiring, and a third wiring respectively and electrically connected to the first pixel column, the second pixel column, and the third pixel column. Each of the first wiring, the second wiring, and the third wiring may include a first line, a second line electrically connected to the first line, the first line and the second line being disposed on different layers, and a third line electrically connected to the second line, the first line, the second line, and the third line being disposed on different layers.

In an embodiment, the first wiring may include a first lower line, a first upper line electrically connected to the first lower line and disposed farther from the substrate than the first lower line, and a first intermediate line electrically connected to the first upper line and disposed farther from the substrate than the first lower line and closer to the substrate than the first upper line.

In an embodiment, the second wiring may include a second upper line, a second intermediate line electrically connected to the second upper line and disposed closer to the substrate than the second upper line, and a second lower line electrically connected to the second intermediate line and disposed closer to the substrate than the second upper line and the second intermediate line.

In an embodiment, the second lower line and the first lower line may be disposed on a same layer, the second intermediate line and the first intermediate line may be disposed on a same layer, the second upper line and the first upper line may be disposed on a same layer, and the first lower line, the first intermediate line, and the first upper line may be disposed on different layers.

In an embodiment, the third wiring may include a third intermediate line, a third lower line electrically connected to the third intermediate line and disposed closer to the substrate than the third intermediate line, and a third upper line electrically connected to the third lower line and disposed farther from the substrate than the third intermediate line and the third lower line.

In an embodiment, the third lower line and the first lower line may be disposed on a same layer, the third intermediate line and the first intermediate line may be disposed on a same layer, and the third upper line and the first upper line may be disposed on a same layer. The second lower line, the second intermediate line, and the second upper line may be disposed on different layers.

In an embodiment, the display device may further include a pixel included in each of the first pixel column, the second pixel column, and the third pixel column. The pixel may include a first active layer disposed on the substrate, a first insulation layer disposed on the first active layer, a first gate electrode disposed on the first insulation layer and overlapping the first active layer, a second insulation layer disposed on the first gate electrode, a capacitor electrode disposed on the second insulation layer and overlapping the first gate electrode, a third insulation layer disposed on the capacitor electrode, a second active layer disposed on the third insulation layer, a fourth insulation layer disposed on the second active layer, and a second gate electrode disposed on the fourth insulation layer and overlapping the second active layer.

In an embodiment, the first line and one of the first gate electrode, the capacitor electrode, and the second gate electrode may be disposed on a same layer, the second line and another of the first gate electrode, the capacitor electrode, and the second gate electrode may be disposed on a same layer, and the third line and the other of the first gate electrode, the capacitor electrode, and the second gate electrode may be disposed on a same layer.

In an embodiment, the pixel may further include a fifth insulation layer disposed on the second gate electrode, and a first source electrode and a first drain electrode disposed on the fifth insulation layer and electrically connected to the first active layer.

In an embodiment, each of the first wiring, the second wiring, and the third wiring may further include a first connection portion electrically connecting the first line and the second line and a second connection portion electrically connecting the second line and the third line, and the first connection portion, the second connection portion, the first source electrode, and the first drain electrode may be disposed on a same layer.

In an embodiment, the second pixel column may emit light having a different color from light emitted from the first pixel column.

In an embodiment, the third pixel column may emit light having the same color as the light emitted from the first pixel column.

In an embodiment, the second line may directly contact the first line, and the third line may directly contacts the second line.

In an embodiment, the display device may further include a first connection portion that electrically connects the second line to the first line, and a second connection portion that electrically connects the third line to the second line.

In an embodiment, the first connection portion and the second connection portion may be disposed on a different layer from the first line, the second line, and the third line.

In an embodiment, each of the first connection portion and the second connection portion may be disposed farther from the substrate than the first line, the second line, and the third line.

In an embodiment, a length of the first line, a length of the second line, and a length of the third line may be the same as each other.

In an embodiment, each of the first line, the second line, and the third line may include at least one bent portion in a plan view.

A display device according to an embodiment may include a pixel column, a driving unit configured to generate a signal applied to the pixel column, and a wiring electrically connecting the pixel column and the driving unit. The wiring may include a first line, a second line electrically connected to the first line, the first line and the second line being disposed on different layers, and a third line electrically connected to the second line, the first line, the second line, and the third line being disposed on different layers.

In an embodiment, a length of the first line, a length of the second line, and a length of the third line may be the same as each other.

In the display device according to the embodiments, each of the first to third wirings respectively and electrically connected to the first to third pixel columns may include the first, second, and third lines disposed on different layers from each other, so that the difference in resistance between the first to third wirings may be reduced, and the difference in luminance between the first to third pixel columns respectively receiving data signals from the first to third wirings may be reduced.

BRIEF DESCRIPTION OF THE DRAWINGS

An additional appreciation according to the embodiments of the invention will become more apparent by describing in detail the embodiments thereof with reference to the accompanying drawings, wherein.

DETAILED DESCRIPTION OF THE EMBODIMENTS

Figure 1:
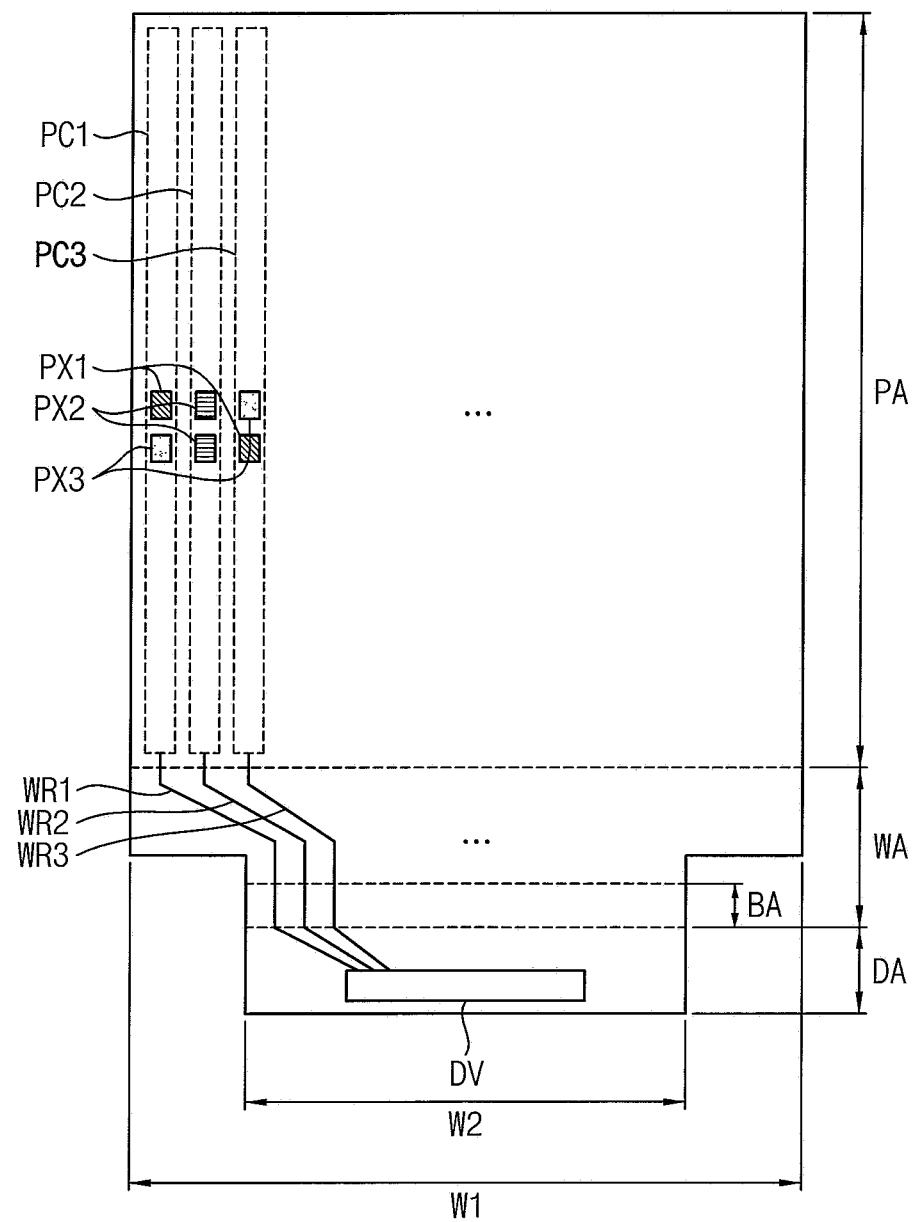
FIG. 1 is a plan view illustrating a display device according to an embodiment.

Embodiments of the invention will be described hereinafter with reference to the accompanying drawings. Although the invention may be modified in various manners and have additional embodiments, embodiments are illustrated in the accompanying drawings and will be described in the specification. However, the scope of the invention is not limited to the embodiments in the accompanying drawings and the specification and should be construed as including all the changes, equivalents and substitutions included in the spirit and scope of the invention.

In the drawings, sizes and thicknesses of elements may be enlarged for clarity and ease of description thereof. However, the invention is not limited to the illustrated sizes and thicknesses. In the drawings, the thicknesses of layers, films, panels, regions, and other elements may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a cross-sectional view" means when a cross-section taken by vertically cutting an object portion is viewed from the side.

When a layer, film, region, substrate, or area, is referred to as being "on" another layer, film, region, substrate, or area, it may be directly on the other film, region, substrate, or area, or intervening films, regions, substrates, or areas, may be present therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Further, "over" or "on" may include positioning on or below an object and does not necessarily imply a direction based upon gravity.

The term "overlap" as used herein may include layer, stack, face or facing, extending over, covering or partly covering or any other suitable term as would be appreciated and understood by those of ordinary skill in the art. The term "do not overlap" as used herein may include "apart from" or "set aside from" or "offset from" and any other suitable equivalents as would be appreciated and understood by those of ordinary skill in the art.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes," and/or "including" are used in this specification, they or it may specify the presence of stated features, integers, steps, operations, elements and/or components, but does not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first layer" is discussed in the description, it may also be termed "a second layer" or "a third layer" in the claims, and "a second layer" and "a third layer" may be termed in a similar manner without departing from the teachings herein.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those of ordinary skill in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a plan view illustrating a display device according to an embodiment.

Referring to FIG. 1, a display device according to an embodiment may include a pixel area PA, a driving area DA, and a wiring area WA.

The pixel area PA may be a display area that displays an image. The pixel area PA may have a substantially rectangular shape in a plan view. The pixel area PA may have a first width W1 in a first direction DR1.

Pixels may be disposed in the pixel area PA. The pixels may be arranged in a substantial matrix form along the first direction DR1, which is a row direction, and a second direction DR2, which is a column direction. Accordingly, pixel columns extending in the second direction DR2 and arranged along the first direction DR1 may be defined by the pixels.

The pixels may include a first pixel PX1 and a third pixel PX3 included in each of a first pixel column PC1 and a third pixel column PC3, and a second pixel PX2 included in a second pixel column PC2. The second pixel column PC2 may be adjacent to the first pixel column PC1 in the first direction DR1, and the third pixel column PC3 may be adjacent to the second pixel column PC2 in the first direction DR1. For example, the second pixel column PC2 may be positioned between the first pixel column PC1 and the third pixel column PC3 in the first direction DR1. The first pixel PX1 and the third pixel PX3 may be disposed in a first row and a second row of the first pixel column PC1, respectively, and the third pixel PX3 and the first pixel PX1 may be disposed in a first row and a second row of the third pixel column PC3, respectively. The second pixel PX2 may be disposed in each of a first row and a second row of the second pixel column PC2.

The first pixel PX1, the second pixel PX2, and the third pixel PX3 may emit light having different colors. In an embodiment, the first pixel PX1, the second pixel PX2, and the third pixel PX3 may emit red light, green light, and blue light, respectively.

Since the second pixel column PC2 includes the second pixel PX2 and the first pixel column PC1 includes the first pixel PX1 and the third pixel PX3, the second pixel column PC2 may emit light having a different color from light emitted from the first pixel column PC1. Further, since each of the first pixel column PC1 and third pixel column PC3 includes the first pixel PX1 and the third pixel PX3, the first pixel column PC1 and the third pixel column PC3 may emit light having a same color. For example, the first pixel column PC1 and the third pixel column PC3 may emit light having the same color, and the second pixel column PC2 may emit light having a different color from light emitted from the first pixel column PC1 and the third pixel column PC3.

The driving area DA may be positioned in the second direction DR2 from the pixel area PA. The driving area DA may have a second width W2, which is less than the first width W1 in the first direction DR1.

A driving unit DV may be disposed in the driving area DA. The driving unit DV may generate signals and voltages applied to the pixel columns. In an embodiment, the driving unit DV may generate data signals applied to the pixel columns.

The wiring area WA may be positioned between the pixel area PA and the driving area DA. Each of the driving area DA and the wiring area WA may be a non-display area that does not display an image. The wiring area WA may include a first portion having the first width W1 in the first direction DR1 and a second portion having the second width W2 in the first direction DR1. The first portion of the wiring area WA may be adjacent to the pixel area PA, and the second portion of the wiring area WA may be adjacent to the driving area DA.

Wirings may be disposed in the wiring area WA. The wirings may electrically connect the pixel columns disposed in the pixel area PA to the driving unit DV disposed in the driving area DA. For example, the wirings may respectively correspond to the pixel columns. The wirings may provide the signals and the voltages generated from the driving unit DV to the pixel columns. In an embodiment, the wirings may provide the data signal generated from the driving unit DV to the pixel columns.

The wirings may include a first wiring WR1 electrically connected to the first pixel column PC1, a second wiring WR2 electrically connected to the second pixel column PC2, and a third wiring WR3 electrically connected to the third pixel column PC3. The second wiring WR2 may be adjacent to the first wiring WR1 in the first direction DR1, and the third wiring WR3 may be adjacent to the second wiring WR2 in the first direction DR1. For example, the second wiring WR2 may be positioned between the first wiring WR1 and the third wiring WR3 in the first direction DR1.

The wiring area WA may include a bendable area BA. The bendable area BA may be adjacent to the driving area DA. In case that the bendable area BA is bent such that the wiring area WA and the driving area DA overlap each other, a planar extent of the driving area DA and the wiring area WA, which are the non-display areas, may be reduced, so that a dead space of the display device may be reduced.

Figure 2:
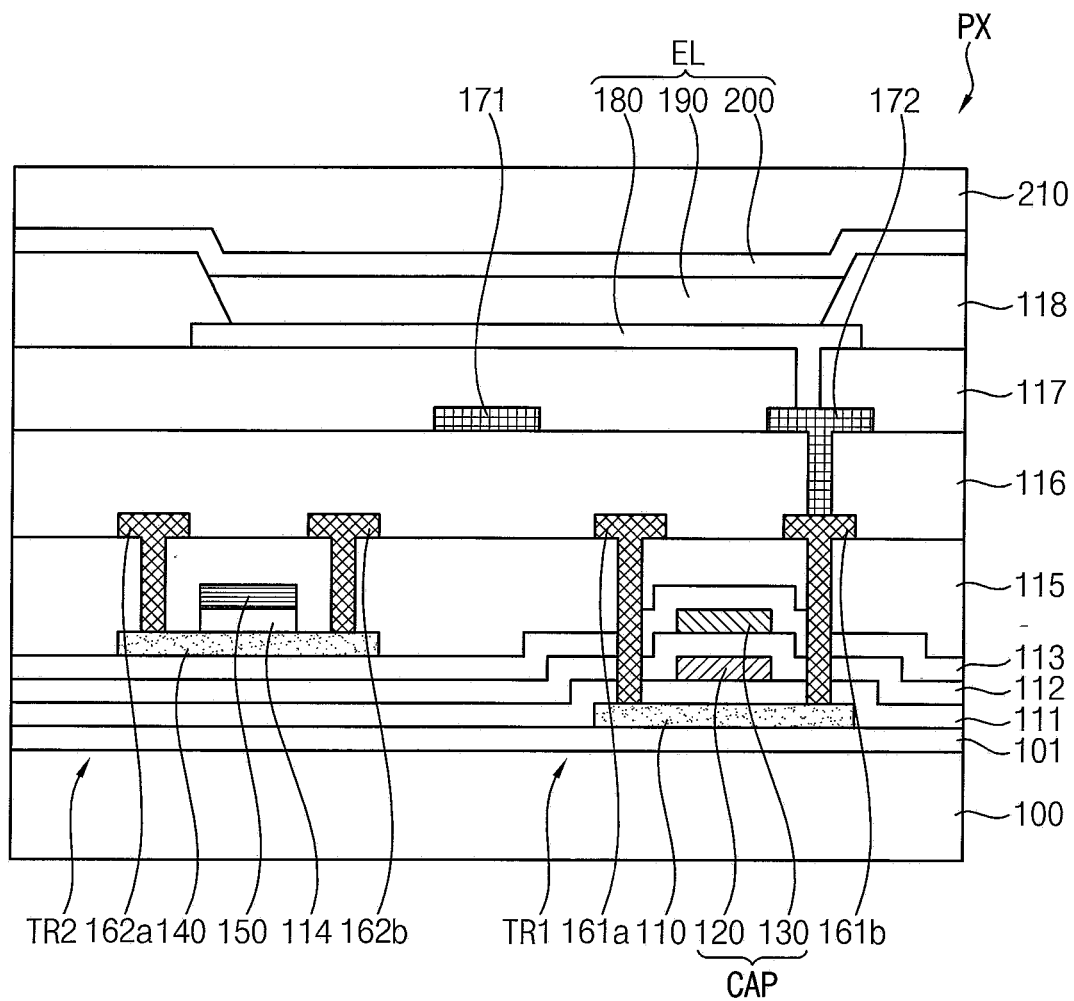
FIG. 2 is a schematic cross-sectional view illustrating a pixel area of the display device of FIG. 1.

FIG. 2 is a schematic cross-sectional view illustrating the pixel area PX of the display device of FIG. 1. For example, FIG. 2 may illustrate any one pixel PX of the first pixel PX1, the second pixel PX2, and the third pixel PX3 illustrated in FIG. 1.

Referring to FIGS. 1 and 2, the pixel PX according to an embodiment may include a first transistor TR1, a second transistor TR2, a capacitor CAP, and a light emitting element EL disposed on a substrate 100.

The substrate 100 may be an insulating substrate including glass, quartz, plastic, or the like. In an embodiment, the substrate 100 may include a first flexible layer, a first barrier layer disposed on the first flexible layer, a second flexible layer disposed on the first barrier layer, and a second barrier layer disposed on the second flexible layer. The first flexible layer and the second flexible layer may include an organic insulation material such as polyimide (PI) or the like, whereas the first barrier layer and the second barrier layer may include an inorganic insulation material such as silicon oxide, silicon nitride, amorphous silicon, or the like.

A buffer layer 101 may be disposed on the substrate 100. The buffer layer 101 may block impurities such as oxygen or moisture from diffusing through and above the substrate 100. Further, the buffer layer 101 may provide a planarized upper surface above the substrate 100. The buffer layer 101 may include an inorganic insulation material such as silicon oxide, silicon nitride, silicon oxynitride, or the like.

A first active layer 110 may be disposed on the buffer layer 101. In an embodiment, the first active layer 110 may include polycrystalline silicon.

The first active layer 110 may include a first source region, a first drain region, and a first channel region disposed between the first source region and the first drain region. The first source region and the first drain region may be doped with P-type or N-type impurities.

A first insulation layer 111 may be disposed on the first active layer 110. The first insulation layer 111 may cover the first active layer 110, and may be disposed on the buffer layer 101. The first insulation layer 111 may insulate a first gate electrode 120 disposed on the first active layer 110 from the first active layer 110. The first insulation layer 111 may include an inorganic insulation material such as silicon oxide, silicon nitride, silicon oxynitride, or the like.

The first gate electrode 120 may be disposed on the first insulation layer 111. The first gate electrode 120 may overlap the first channel region of the first active layer 110. The first gate electrode 120 may include a conductive material such as molybdenum (Mo), copper (Cu), or the like. The first active layer 110, the first insulation layer 111, and the first gate electrode 120 may form the first transistor TR1.

A second insulation layer 112 may be disposed on the first gate electrode 120. The second insulation layer 112 may cover the first gate electrode 120, and may be disposed on the first insulation layer 111. The second insulation layer 112 may insulate a capacitor electrode 130 disposed on the first gate electrode 120 from the first gate electrode 120. The second insulation layer 112 may include an inorganic insulation material such as silicon oxide, silicon nitride, silicon oxynitride, or the like.

The capacitor electrode 130 may be disposed on the second insulation layer 112. The capacitor electrode 130 may overlap the first gate electrode 120. The first gate electrode 120, the second insulation layer 112, and the capacitor electrode 130 may form the capacitor CAP.

A third insulation layer 113 may be disposed on the capacitor electrode 130. The third insulation layer 113 may cover the capacitor electrode 130 and may be disposed on the second insulation layer 112. The third insulation layer 113 may include an inorganic insulation material such as silicon oxide, silicon nitride, silicon oxynitride, or the like.

A second active layer 140 may be disposed on the third insulation layer 113. The second active layer 140 may not overlap the capacitor electrode 130. Accordingly, the second active layer 140 may not overlap the first gate electrode 120 and the first active layer 110.

In an embodiment, the second active layer 140 may include an oxide semiconductor. For example, the oxide semiconductor may include indium gallium zinc oxide (IGZO), zinc tin oxide (ZTO), indium zinc oxide (IZO), or the like.

The second active layer 140 may include a second source region, a second drain region, and a second channel region disposed between the second source region and the second drain region. The second source region and the second drain region may be doped with P-type or N-type impurities.

A fourth insulation layer 114 may be disposed on the second active layer 140. The fourth insulation layer 114 may insulate a second gate electrode 150 disposed on the second active layer 140 from the second active layer 140. The fourth insulation layer 114 may overlap the second channel region of the second active layer 140. Since the fourth insulation layer 114 does not cover the second source region and the second drain region of the second active layer 140, a fifth insulation layer 115 may directly contact the second source region and the second drain region of the second active layer 140. Accordingly, hydrogen may be diffused from the fifth insulation layer 115 adjacent to the second source region and the second drain region of the second active layer 140, so that the second source region and the second drain region of the second active layer 140 may become conductive. The fourth insulation layer 114 may include an inorganic insulation material such as silicon oxide, silicon nitride, silicon oxynitride, or the like.

The second gate electrode 150 may be disposed on the fourth insulation layer 114. The second gate electrode 150 may overlap the second channel region of the second active layer 140. The second gate electrode 150 may include a conductive material such as molybdenum (Mo), copper (Cu), or the like. The second active layer 140, the fourth insulation layer 114, and the second gate electrode 150 may form the second transistor TR2.

The fifth insulation layer 115 may be disposed on the second gate electrode 150. The fifth insulation layer 115 may cover the second gate electrode 150, and may be disposed on the third insulation layer 113. The fifth insulation layer 115 may include an inorganic insulation material such as silicon oxide, silicon nitride, silicon oxynitride, or the like and/or an organic insulation material such as polyimide (PI) or the like.

A first source electrode 161a, a first drain electrode 161b, a second source electrode 162a, and a second drain electrode 162b may be disposed on the fifth insulation layer 115. The first source electrode 161a and the first drain electrode 161b may be electrically connected to the first source region and the first drain region of the first active layer 110, respectively. The second source electrode 162a and the second drain electrode 162b may be electrically connected to the second source region and the second drain region of the second active layer 140, respectively. The first source electrode 161a, the first drain electrode 161b, the second source electrode 162a, and the second drain electrode 162b may include a conductive material such as aluminum (Al), titanium (Ti), copper (Cu), or the like.

A sixth insulation layer 116 may be disposed on the first source electrode 161a, the first drain electrode 161b, the second source electrode 162a, and the second drain electrode 162b. The sixth insulation layer 116 may cover the first source electrode 161a, the first drain electrode 161b, the second source electrode 162a, and the second drain electrode 162b, and may be disposed on the fifth insulation layer 115. The sixth insulation layer 116 may provide a planarized surface above the first transistor TR1, the second transistor TR2, and the capacitor CAP. The sixth insulation layer 116 may include an inorganic insulation material such as silicon oxide, silicon nitride, silicon oxynitride, or the like and/or an organic insulation material such as polyimide (PI) or the like.

A data line 171 and a connection electrode 172 may be disposed on the sixth insulation layer 116. The data line 171 may extend in the second direction DR2, and may provide a data signal to the pixel PX. The connection electrode 172 may contact the first source electrode 161a or the first drain electrode 161b through a contact hole formed in the sixth insulation layer 116. The data line 171 and the connection electrode 172 may include a conductive material such as aluminum (Al), titanium (Ti), copper (Cu), or the like.

A seventh insulation layer 117 may be disposed on the data line 171 and the connection electrode 172. The seventh insulation layer 117 may cover the data line 171 and the connection electrode 172, and may be disposed on the sixth insulation layer 116. The seventh insulation layer 117 may include an inorganic insulation material such as silicon oxide, silicon nitride, silicon oxynitride, or the like and/or an organic insulation material such as polyimide (PI) or the like.

A first electrode 180 may be disposed on the seventh insulation layer 117. The first electrode 180 may be electrically connected to the connection electrode 172. For example, the first electrode 180 may contact the connection electrode 172 through a contact hole formed in the seventh insulation layer 117. The first electrode 180 may include a conductive material such as metal, alloy, transparent conductive oxide, or the like. For example, the first electrode 180 may include silver (Ag), indium tin oxide (ITO), or the like.

An eighth insulation layer 118 may be disposed on the first electrode 180. The eighth insulation layer 118 may cover the first electrode 180, and may be disposed on the seventh insulation layer 117. The eighth insulation layer 118 may have a pixel opening that exposes at least a portion of the first electrode 180. In an embodiment, the pixel opening may expose a central portion of the first electrode 180, and the eighth insulation layer 118 may cover a peripheral portion of the first electrode 180. The eighth insulation layer 118 may include an organic insulation material such as polyimide (PI) or the like.

An emission layer 190 may be disposed on the first electrode 180. The emission layer 190 may be disposed on the first electrode 180 exposed by the pixel opening. The emission layer 180 may include at least one of an organic light emitting material and a quantum dot.

In an embodiment, the organic light emitting material may include a low molecular organic compound or a high molecular organic compound. For example, the low molecular organic compound may include copper phthalocyanine, diphenylbenzidine (N, N'-diphenylbenzidine), trihydroxyquinoline aluminum (tris-(8-hydroxyquinoline)aluminum), or the like. The high molecular organic compound may include poly ethylenedioxythiophene (poly(3,4-ethylenedioxythiophene), polyaniline, polyphenylenevinylene, polyfluorene, or the like.

In an embodiment, the quantum dot may include a core including a group II-VI compound, a group III-V compound, a group IV-VI compound, a group IV element, a group IV compound, or a combination thereof. In one embodiment, the quantum dot can have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

A second electrode 200 may be disposed on the emission layer 190. In an embodiment, the second electrode 120 may also be disposed on the eighth insulation layer 118. The second electrode 200 may include a conductive material such as metal, alloy, transparent conductive oxide, or the like. For example, the second electrode 200 may include aluminum (Al), platinum (Pt), silver (Ag), magnesium (Mg), gold (Au), chromium (Cr), tungsten (W), titanium (Ti), or the like. The first electrode 180, the emission layer 190, and the second electrode 200 may form the light emitting element EL.

An encapsulation layer 210 may be disposed on the second electrode 200. The encapsulation layer 200 may cover the light emitting element EL to protect the light emitting element EL from impurities such as oxygen, moisture, or the like. The encapsulation layer 210 may include at least one inorganic encapsulation layer and at least one organic encapsulation layer. In an embodiment, the encapsulation layer 210 may include a first inorganic encapsulation layer disposed on the second electrode 200, an organic encapsulation layer disposed on the first inorganic encapsulation layer, and a second inorganic encapsulation layer disposed on the organic encapsulation layer. The inorganic encapsulation layer may include silicon nitride, silicon oxynitride or the like, and the organic encapsulation layer may include epoxy-based resin, acryl-based resin, polyimide-based resin or the like.

Figure 3:
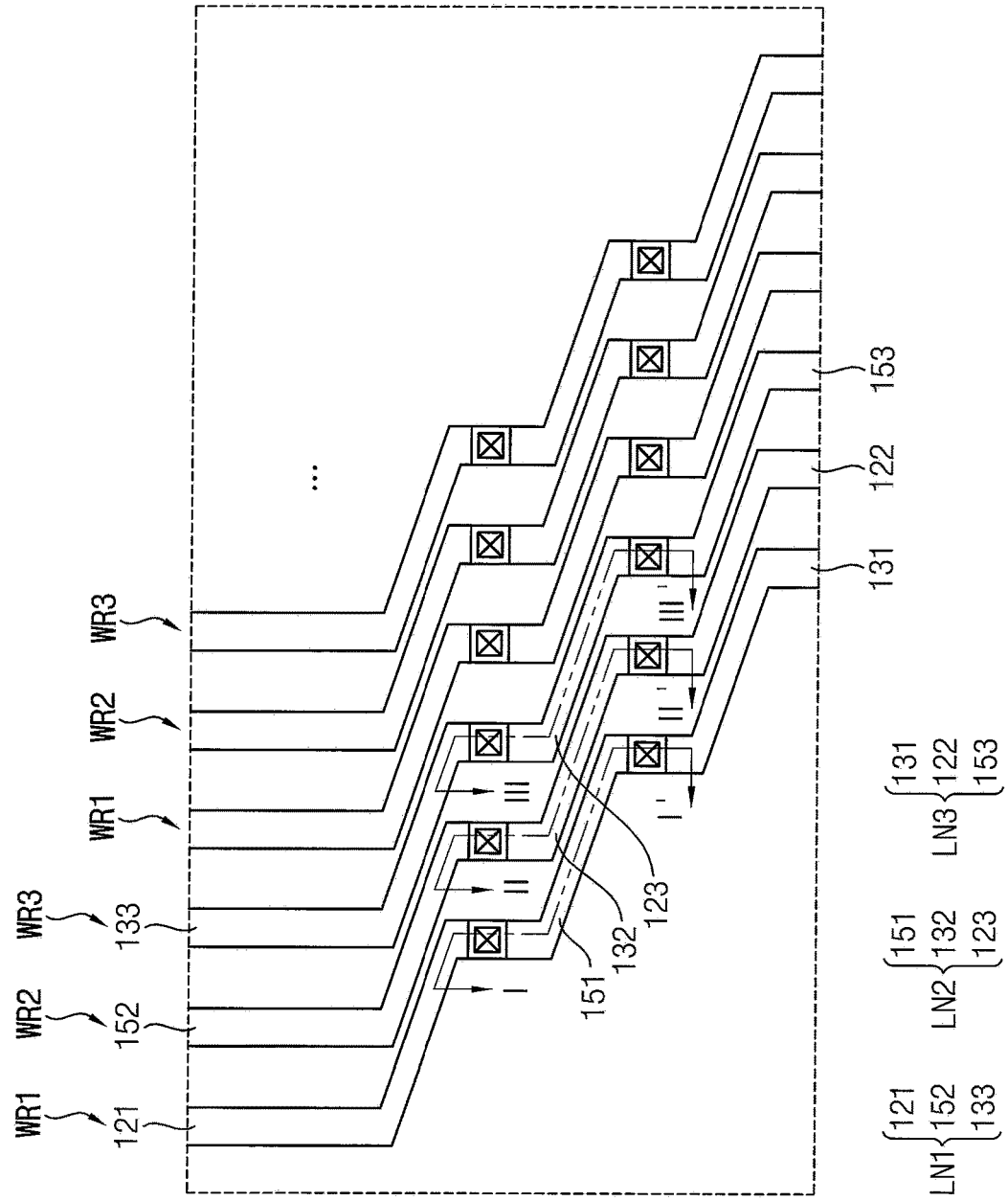
FIG. 3 is a plan view illustrating an example of a wiring area of the display device of FIG. 1.
Figure 4:
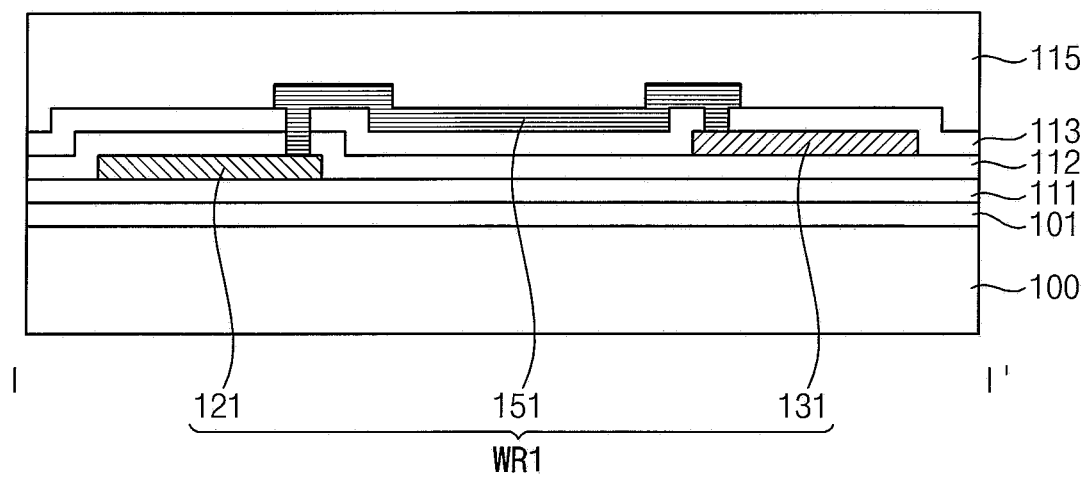
FIG. 4 is a schematic cross-sectional view taken along a line I-I' of FIG. 3.
Figure 5:
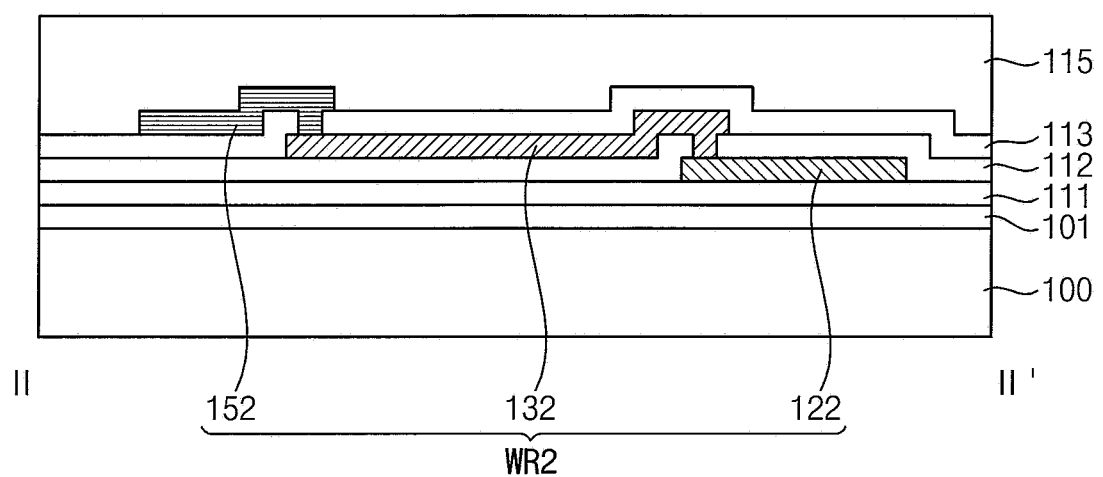
FIG. 5 is a schematic cross-sectional view taken along a line II-II' of FIG. 3.
Figure 6:
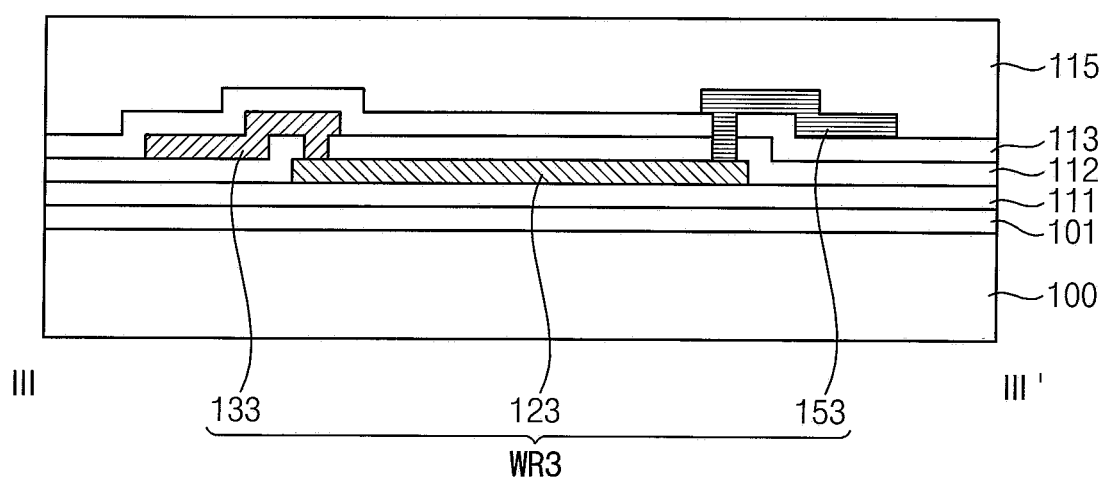
FIG. 6 is a schematic cross-sectional view taken along a line III-III' of FIG. 3.

FIG. 3 is a plan view illustrating an example of the wiring area WA of the display device of FIG. 1. FIG. 4 is a schematic cross-sectional view taken along a line I-I' of FIG. 3. FIG. 5 is a schematic cross-sectional view taken along a line II-II' of FIG. 3. FIG. 6 is a schematic cross-sectional view taken along a line III-III' of FIG. 3.

Referring to FIGS. 2 to 6, each of the first wiring WR1, the second wiring WR2, and the third wiring WR3 may include a first line LN1, a second line LN2 electrically connected to the first line LN1, and a third line LN3 electrically connected to the second line LN2. The second line LN2 and the first line LN1 may be disposed on different layers, and third line LN3, the first line LN1, and the second line LN2 may be disposed on different layers. In other words, the first line LN1, the second line LN2, and the third line LN3 may be disposed on different layers from each other.

In an embodiment, the first line LN1 and one of the first gate electrode 120, the capacitor electrode 130, and the second gate electrode 150 may be disposed on a same layer; the second line LN2 and another of the first gate electrode 120, the capacitor electrode 130, and the second gate electrode 150 may be disposed on a same layer; and the third line LN3 and the other of the first gate electrode 120, the capacitor electrode 130, and the second gate electrode 150. may be disposed on a same layer In an embodiment, the first line LN1 of the first wiring WR1, the first line LN1 of the second wiring WR2, and the first line LN1 of the third wiring WR3 may be disposed on different layers from each other, the second line LN2 of the first wiring WR1, the second line LN2 of the second wiring WR2, and the second line LN2 of the third wiring WR3 may be disposed on different layers from each other, and the third line LN3 of the first wiring WR1, the third line LN3 of the second wiring WR2, and the third line LN3 of the third wiring WR3 may be disposed on different layers from each other.

In an embodiment, the first wiring WR1 may include a first lower line 121, a first upper line 151 electrically connected to the first lower line 121, and a first intermediate line 131 electrically connected to the first upper line 151. In such an embodiment, the first lower line 121, the first upper line 151, and the first intermediate line 131 may be included in the first line LN1, the second line LN2, and the third line LN3, respectively. The first upper line 151 may be disposed farther from the substrate 100 than the first lower line 121, and the first intermediate line 131 may be disposed farther from the substrate 100 than the first lower line 121 and closer to the substrate 100 than the first upper line 151.

In an embodiment, the first lower line 121 and the first gate electrode 120 may be disposed on a same layer, the first upper line 151 and the second gate electrode 150 may be disposed on a same layer, and the first intermediate line 131 and the capacitor electrode 130 may be disposed on a same layer. For example, the first lower line 121 may be disposed on the first insulation layer 111, the first intermediate line 131 may be disposed on the second insulation layer 112, and the first upper line 151 may be disposed on the third insulation layer 113.

In an embodiment, the second wiring WR2 may include a second upper line 152, a second intermediate line 132 electrically connected to the second upper line 152, and a second lower line 122 electrically connected to the second intermediate line 132. In such an embodiment, the second upper line 152, the second intermediate line 132, and the second lower line 122 may be included in the first line LN1, the second line LN2, and the third line LN3, respectively. The second intermediate line 132 may be disposed closer to the substrate 100 than the second upper line 152, and the second lower line 122 may be disposed closer to the substrate 100 than the second upper line 152 and the second intermediate line 132.

In an embodiment, the second lower line 122 and the first lower line 121 may be disposed on a same layer, the second intermediate line 132 and the first intermediate line 131 may be disposed on a same layer, and the second upper line 152 and the first upper line 151 may be disposed on a same layer.

In an embodiment, the second upper line 152 and the second gate electrode 150 may be disposed on a same layer, the second intermediate line 132 and the capacitor electrode 130 may be disposed on a same layer, and the second lower line 122 and the first gate electrode 120 may be disposed on a same layer. For example, the second lower line 122 may be disposed on the first insulation layer 111, the second intermediate line 132 may be disposed on the second insulation layer 112, and the second upper line 152 may be disposed on the third insulation layer 113.

In an embodiment, the third wiring WR3 may include a third intermediate line 133, a third lower line 123 electrically connected to the third intermediate line 133, and a third upper line 153 electrically connected to the third lower line 123. In such an embodiment, the third intermediate line 133, the third lower line 123, and the third upper line 153 may be included in the first line LN1, the second line LN2, and the third line LN3, respectively. The third lower line 123 may be disposed closer to the substrate 100 than the third intermediate line 133, and the third upper line 153 may be disposed farther from the substrate 100 than the third intermediate line 133 and the third lower line 123.

In an embodiment, the third lower line 123 and the first lower line 121 may be disposed on a same layer, the third intermediate line 133 and the first intermediate line 131 may be disposed on a same layer, and the third upper line 153 and the first upper line 151 may be disposed on a same layer. Further, the third lower line 123 and the second lower line 122 may be disposed on a same layer, the third intermediate line 133 and the second intermediate line 132 may be disposed on a same layer, and the third upper line 153 and the second upper line 152 may be disposed on a same layer.

In an embodiment, the third intermediate line 133 and the capacitor electrode 130 may be disposed on a same layer, the third lower line 123 and the first gate electrode 120 may be disposed on a same layer, and the third upper line 153 and the second gate electrode 150 may be disposed on a same layer. For example, the third lower line 123 may be disposed on the first insulation layer 111, the third intermediate line 133 may be disposed on the second insulation layer 112, and the third upper line 153 may be disposed on the third insulation layer 113.

In an embodiment, the second line LN2 may directly contact the first line LN1, and the third line LN3 may directly contact the second line LN2. In the first wiring WR1, the first upper line 151 may directly contact the first lower line 121 through a contact hole formed in the second insulation layer 112 and the third insulation layer 113, and the first intermediate line 131 may directly contact the first upper line 151 through a contact hole formed in the third insulation layer 113. In the second wiring WR2, the second intermediate line 132 may directly contact the second upper line 152 through a contact hole formed in the third insulation layer 113, and the second lower line 122 may directly contact the second intermediate line 132 through a contact hole formed in the second insulation layer 112. In the third wiring WR3, the third lower line 123 may directly contact the third intermediate line 133 through a contact hole formed in the second insulation layer 112, and the third upper line 153 may directly contact the third lower line 123 through a contact hole formed in the second insulation layer 112 and the third insulation layer 113.

In an embodiment, a length of the first line LN1, a length of the second line LN2, and a length of the third line LN3 of each of the first wiring WR1, the second wiring WR2, and the third wiring WR3 may be substantially the same as each other. Because the first line LN1, the second line LN2, and the third line LN3 of each of the first wiring WR1, the second wiring WR2, and the third wiring WR3 are disposed on different layers from each other, the first line LN1, the second line LN2, and the third line LN3 of each of the first wiring WR1, the second wiring WR2, and the third wiring WR3 may have different widths from each other because of their different etching characteristics even in case that the first line LN 1, the second line LN2, and the third line LN3 of each of the first wiring WR1, the second wiring WR2, and the third wiring WR3 include the same material as each other. Therefore, the first line LN1, the second line LN2, and the third line LN3 of each of the first wiring WR1, the second wiring WR2, and the third wiring WR3 may have different resistances from each other. However, in case that the length of the first line LN1, the length of the second line LN2, and the length of the third line LN3 of each of the first wiring WR1, the second wiring WR2, and the third wiring WR3 are substantially the same as each other, the first wiring WR1, the second wiring WR2, and the third wiring WR3 may have substantially the same resistance from each other because each of the first wiring WR1, the second wiring WR2, and the third wiring WR3 include the first line LN1, the second line LN2, and the third line LN3. For example, the first wiring WR1, the second wiring WR2, and the third wiring WR3 may have substantially the same resistance as each other because lengths of the first lower line 121, the second lower line 122, and the third lower line 123 disposed on the same layer are the same, lengths of the first intermediate line 131, the second intermediate line 132, and the third intermediate line 133 disposed on the same layer are the same, and lengths of the first upper line 151, the second upper line 152, and the third upper line 153 disposed on the same layer are the same.

In an embodiment, each of the first line LN1, the second line LN2, and the third line LN3 may be bent at least once in a plan view. For example, each of the first line LN1, the second line LN2, and the third line LN3 may include at least one bent portion in a plan view. As illustrated in FIG. 1, because the width W2 of the second portion of the wiring area WA adjacent to the driving area DA is less than the width W1 of the first portion of the wiring area WA adjacent to the pixel area PA, the first wiring WR1, the second wiring WR2, and the third wiring WR3 extending from the pixel area PA toward the driving area DA may be bent toward the driving unit DV. Accordingly, each of the first line LN1, the second line LN2, and the third line LN3 may be bent at least once in a plan view.

Figure 7:
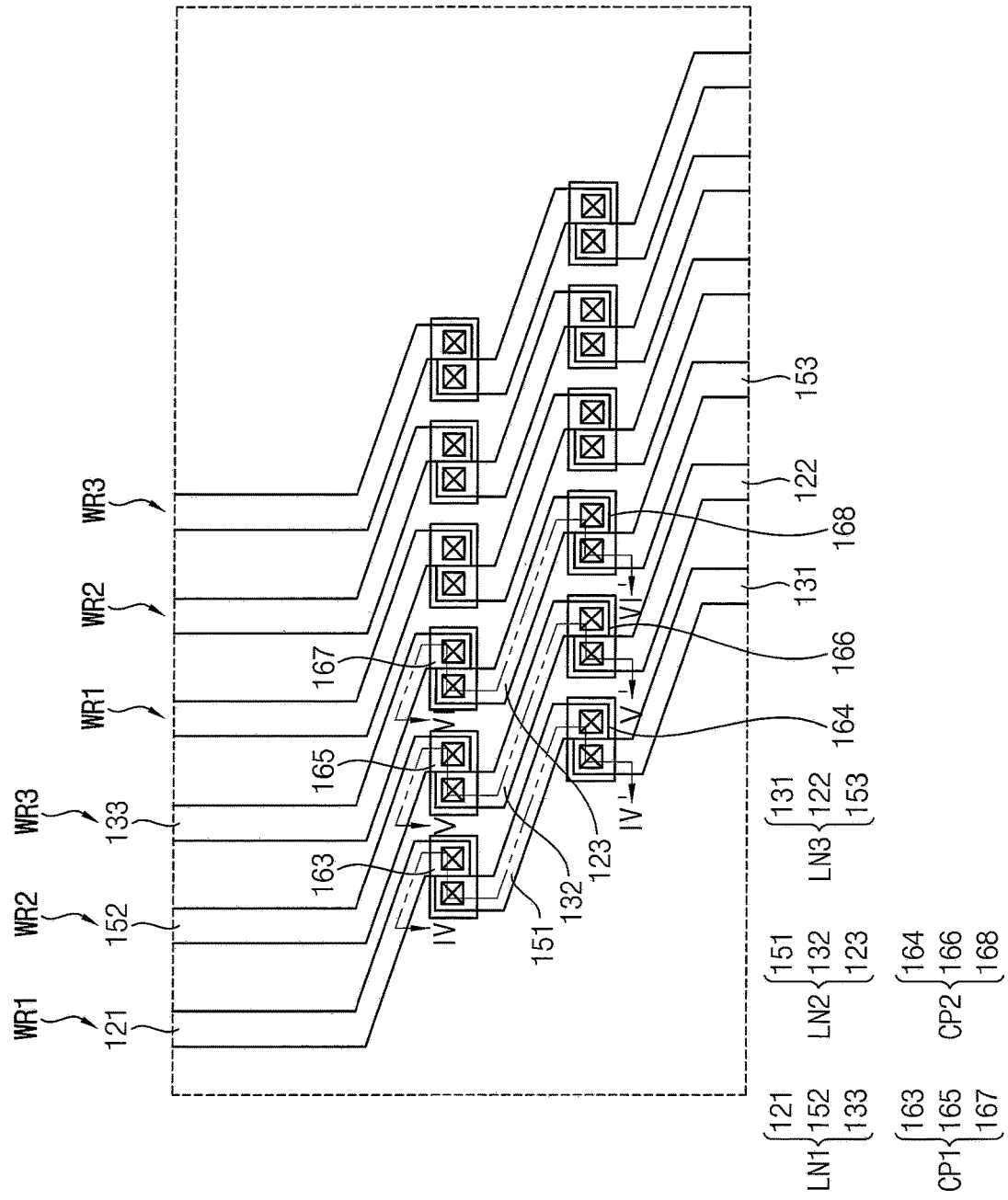
FIG. 7 is a plan view illustrating another example of the wiring area of the display device of FIG. 1.
Figure 8:
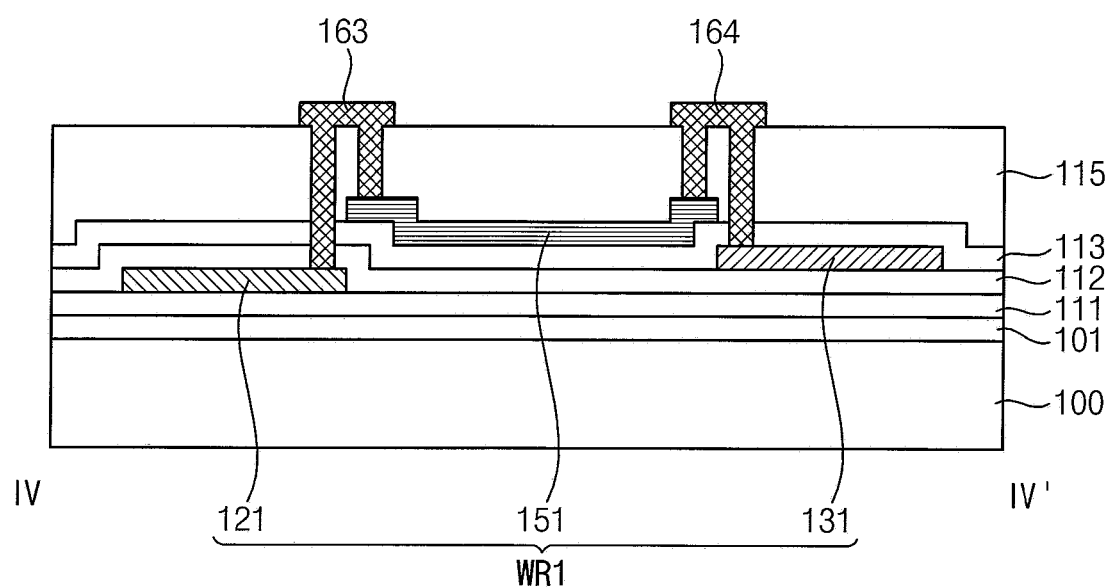
FIG. 8 is a schematic cross-sectional view taken along a line IV-IV' of FIG. 7.
Figure 9:
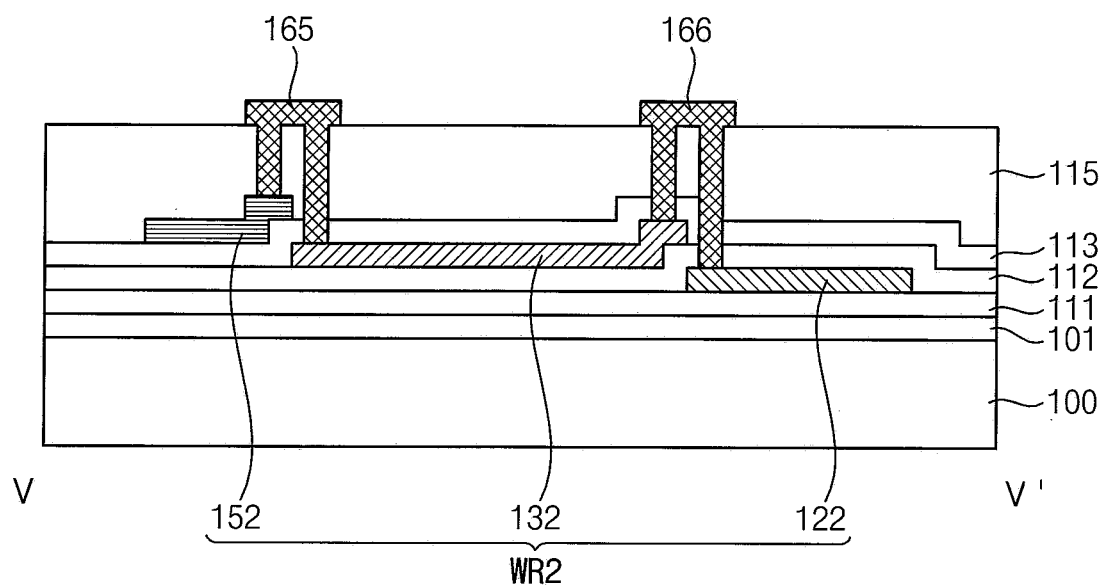
FIG. 9 is a schematic cross-sectional view taken along a line V-V' of FIG. 7.
Figure 10:
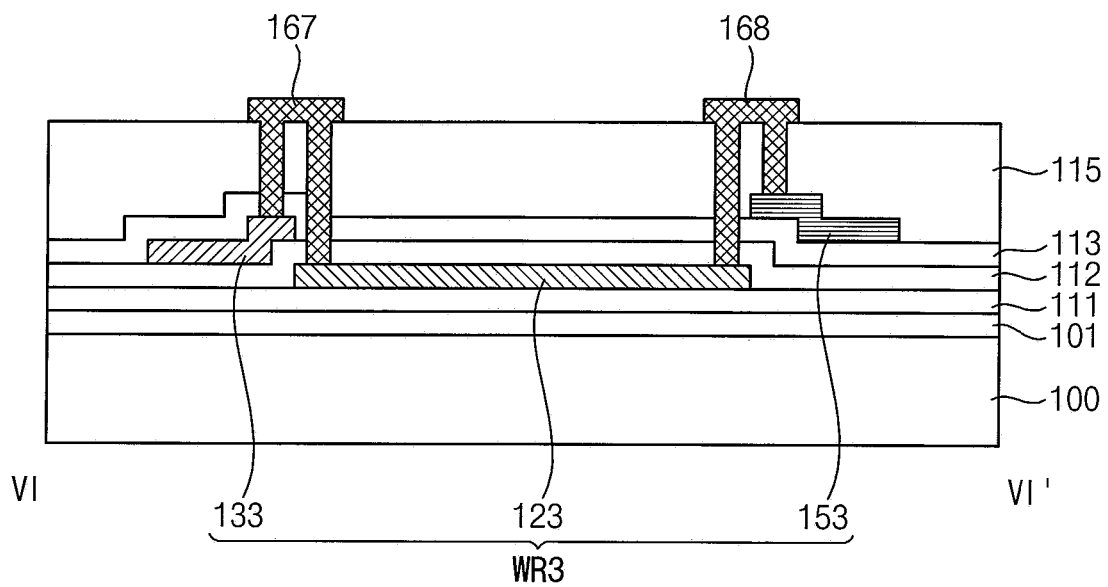
FIG. 10 is schematic a cross-sectional view taken along a line VI-VI' of FIG. 7.

FIG. 7 is a plan view illustrating another example of the wiring area WA of the display device of FIG. 1. FIG. 8 is a schematic cross-sectional view taken along a line IV-IV' of FIG. 7. FIG. 9 is a schematic cross-sectional view taken along a line V-V' of FIG. 7. FIG. 10 is a schematic cross-sectional view taken along a line VI-VI' of FIG. 7.

Descriptions on elements of a first wiring WR1, a second wiring WR2, and a third wiring WR3 described with reference to FIGS. 7 to 10 that are substantially the same as or similar to those on the first wiring WR1, the second wiring WR2, and the third wiring WR3 described with reference to FIGS. 3 to 6, may not be repeated.

Referring to FIGS. 7 to 10, in an embodiment, the second line LN2 may be electrically connected to the first line LN1 through a first connection portion CP1, and the third line LN3 may be electrically connected to the second line LN2 through the second connection portion CP2. In other words, each of the first wiring WR1, the second wiring WR2, and the third wiring WR3 may further include the first connection portion CP1 electrically connecting the first line LN1 and the second line LN2 and the second connection portion CP2 electrically connecting the second line LN2 and the third line LN3.

In an embodiment, the first connection portion CP1 and the second connection portion CP2 may be disposed on a different layer from the first line LN1, the second line LN2, and the third line LN3. For example, the first connection portion CP1 and the second connection portion CP2 may be disposed farther from the substrate 100 than the first line LN1, the second line LN2, and the third line LN3.

The first wiring WR1 may include a third connection portion 163 electrically connecting the first lower line 121 and the first upper line 151 and a fourth connection portion 164 electrically connecting the first upper line 151 and the first intermediate line 131. The second wiring WR2 may include a fifth connection portion 165 electrically connecting the second upper line 152 and the second intermediate line 132 and a sixth connection portion 166 electrically connecting the second intermediate line 132 and the second lower line 122. The third wiring WR3 may include a seventh connection portion 167 electrically connecting the third intermediate line 133 and the third lower line 123 and an eighth connection portion 168 connecting the third lower line 123 and the third upper line 153. The third connection portion 163, the fifth connection portion 165, and the seventh connection portion 167 may be included in the first connection portion CP1, whereas the fourth connection portion 164, the sixth connection portion 166, and the eighth connection portion 168 may be included in the second connection portion CP2.

In an embodiment, the first connection portion CP1, the second connection portion CP2, the first source electrode 161a, the first drain electrode 161b, the second source electrode 162a, and the second drain electrode 162b may be disposed on a same layer (also refer to FIG. 2). For example, the first connection portion CP1 and the second connection portion CP2 may be disposed on the fifth insulation layer 115.

In the first wiring WR1, the third connection portion 163 may contact the first lower line 121 through a contact hole formed in the second insulation layer 112, the third insulation layer 113, and the fifth insulation layer 115, and may contact the first upper line 151 through a contact hole formed in the fifth insulation layer 115. The fourth connection portion 164 may contact the first upper line 151 through a contact hole formed in the fifth insulation layer 115, and may contact the first intermediate line 131 through a contact hole formed in the third insulation layer 113 and the fifth insulation layer 115.

In the second wiring WR2, the fifth connection portion 165 may contact the second upper line 152 through a contact hole formed in the fifth insulation layer 115, and may contact the second intermediate line 132 through a contact hole formed in the third insulation layer 113 and the fifth insulation layer 115. The sixth connection portion 166 may contact the second intermediate line 132 through a contact hole formed in the third insulation layer 113 and the fifth insulation layer 115, and may contact the second lower line 122 through a contact hole formed in the second insulation layer 112, the third insulation layer 113, and the fifth insulation layer 115.

In the third wiring WR3, the seventh connection portion 167 may contact the third intermediate line 133 through a contact hole formed in the third insulation layer 113 and the fifth insulation layer 115, and may contact the third lower line 123 through a contact hole formed in the second insulation layer 112, the third insulation layer 113, and the fifth insulation layer 115. The eighth connection portion 168 may contact the third lower line 123 through a contact hole formed in the second insulation layer 112, the third insulation layer 113, and the fifth insulation layer 115, and may contact the third upper line 153 through a contact hole formed in the fifth insulation layer 115.

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary skill in the relevant technical art without departing from the technical spirit described in the following claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A display device, comprising:
a first pixel column disposed on a substrate;
a second pixel column adjacent to the first pixel column;
a third pixel column adjacent to the second pixel column; and a first wiring, a second wiring, and a third wiring respectively and electrically connected to the first pixel column, the second pixel column, and the third pixel column, wherein each of the first wiring, the second wiring, and the third wiring includes:
- a first line;
- a second line electrically connected to the first line, the first line and the second line being disposed on different layers; and
- a third line electrically connected to the second line, the first line, the second line, and the third line being disposed on different layers, and at least one of a length of the first line, a length of the second line, and a length of the third line are same for each of the first wiring, the second wiring, and the third wiring.

2. The display device of claim 1, wherein the first wiring includes:
- a first lower line;
- a first upper line electrically connected to the first lower line and disposed farther from the substrate than the first lower line; and
- a first intermediate line electrically connected to the first upper line and disposed farther from the substrate than the first lower line and closer to the substrate than the first upper line.

3. The display device of claim 2, wherein the second wiring includes:
- a second upper line;
- a second intermediate line electrically connected to the second upper line and disposed closer to the substrate than the second upper line; and
- a second lower line electrically connected to the second intermediate line and disposed closer to the substrate than the second upper line and the second intermediate line.

4. The display device of claim 3, wherein
the second lower line and the first lower line are disposed on a same layer,
the second intermediate line and the first intermediate line are disposed on a same layer, and
the second upper line and the first upper line are disposed on a same layer.

5. The display device of claim 3, wherein the third wiring includes:
- a third intermediate line;
- a third lower line electrically connected to the third intermediate line and disposed closer to the substrate than the third intermediate line; and
- a third upper line electrically connected to the third lower line and disposed farther from the substrate than the third intermediate line and the third lower line.

6. The display device of claim 5, wherein
the third lower line and the first lower line are disposed on a same layer,
the third intermediate line and the first intermediate line are disposed on a same layer, and
the third upper line and the first upper line are disposed on a same layer.

7. The display device of claim 1, further comprising a pixel included in each of the first pixel column, the second pixel column, and the third pixel column, wherein the pixel includes:
- a first active layer disposed on the substrate;
- a first insulation layer disposed on the first active layer;
- a first gate electrode disposed on the first insulation layer and overlapping the first active layer;
- a second insulation layer disposed on the first gate electrode;
- a capacitor electrode disposed on the second insulation layer and overlapping the first gate electrode;
- a third insulation layer disposed on the capacitor electrode;
- a second active layer disposed on the third insulation layer;
- a fourth insulation layer disposed on the second active layer; and
- a second gate electrode disposed on the fourth insulation layer and overlapping the second active layer.

8. The display device of claim 7, wherein
the first line and one of the first gate electrode, the capacitor electrode, and the second gate electrode is disposed on a same layer,
the second line and another of the first gate electrode, the capacitor electrode, and the second gate electrode is disposed on a same layer, and
the third line and the other of the first gate electrode, the capacitor electrode and the second gate electrode is disposed on a same layer.

9. The display device of claim 8, wherein the pixel further includes:
- a fifth insulation layer disposed on the second gate electrode; and
- a first source electrode and a first drain electrode disposed on the fifth insulation layer and electrically connected to the first active layer.

10. The display device of claim 9, wherein
each of the first wiring, the second wiring, and the third wiring further includes:
- a first connection portion electrically connecting the first line and the second line; and
- a second connection portion electrically connecting the second line and the third line, and the first connection portion, the second connection portion, the first source electrode, and the first drain electrode are disposed on a same layer.

11. The display device of claim 1, wherein the second pixel column emits a light having a different color from a light emitted from the first pixel column.

12. The display device of claim 11, wherein the third pixel column emits a light having a same color as the light emitted from the first pixel column.

13. The display device of claim 1, wherein
the second line directly contacts the first line, and
the third line directly contacts the second line.

14. The display device of claim 1, wherein each of the first wiring, the second wiring, and the third wiring further includes:
- a first connection portion that electrically connects the second line to the first line; and
- a second connection portion that electrically connects the third line to the second line.

15. The display device of claim 14, wherein the first connection portion and the second connection portion are disposed on a different layer from the first line, the second line, and the third line.

16. The display device of claim 15, wherein each of the first connection portion and the second connection portion are disposed farther from the substrate than the first line, the second line, and the third line.

17. The display device of claim 1, wherein the length of the first line, the length of the second line, and the length of the third line are same for each of the first wiring, the second wiring, and the third wiring.

18. The display device of claim 1, wherein each of the first line, the second line, and the third line includes at least one bent portion in a plan view.

19. A display device, comprising:
- a pixel column;
- a driving unit configured to generate a signal applied to the pixel column; and
- a wiring electrically connecting the pixel column and the driving unit, wherein the wiring includes:
  - a first line;
  - a second line electrically connected to the first line, the first line and the second line being disposed on different layers; and
  - a third line electrically connected to the second line, the first line, the second line, and the third line being disposed on different layers, and
- at least one of a length of the first line, a length of the second line, and a length of the third line are same for each of the wiring and another wiring.

20. The display device of claim 19, wherein the length of the first line, the length of the second line, and the length of the third line are same for each of the wiring and another wiring.

* * * * *